(12) United States Patent
Ashworth et al.

(10) Patent No.: US 9,578,205 B2
(45) Date of Patent: Feb. 21, 2017

(54) METHOD AND SYSTEM FOR FORMING A HALFTONE SCREEN

(71) Applicant: Megadot Systems Limited, Petone, Lower Hutt (NZ)

(72) Inventors: William Frederick Ashworth, Lower Hutt (NZ); Andrew McKenzie Fraser, Auckland (NZ)

(73) Assignee: Megadot Systems Limited, Petone, Lower Hutt (NZ)

( * ) Notice: Subject to any disclaimer, the term of this patent is extended or adjusted under 35 U.S.C. 154(b) by 0 days.

(21) Appl. No.: 14/765,565

(22) PCT Filed: Dec. 15, 2013

(86) PCT No.: PCT/IB2013/060963
§ 371 (c)(1),
(2) Date: Aug. 3, 2015

(87) PCT Pub. No.: WO2014/102655
PCT Pub. Date: Jul. 3, 2014

(65) Prior Publication Data
US 2015/0341526 A1 Nov. 26, 2015

Related U.S. Application Data

(60) Provisional application No. 61/745,667, filed on Dec. 24, 2012.

(51) Int. Cl.
*H04N 1/405* (2006.01)
*G06K 15/02* (2006.01)
*G03F 5/00* (2006.01)

(52) U.S. Cl.
CPC .............. *H04N 1/4057* (2013.01); *G03F 5/00* (2013.01); *G06K 15/1881* (2013.01)

(58) Field of Classification Search
None
See application file for complete search history.

(56) References Cited

U.S. PATENT DOCUMENTS

| | | |
|---|---|---|
| 5,099,259 A | 3/1992 | Hirahara et al. |
| 5,680,222 A | 10/1997 | Ashworth |

(Continued)

FOREIGN PATENT DOCUMENTS

| | | |
|---|---|---|
| EP | 0370271 B1 | 1/1996 |
| EP | 0454274 B1 | 7/1996 |

(Continued)

OTHER PUBLICATIONS

International Application No. PCT/IB2013/060963, International Search Report and Written Opinion mailed Apr. 22, 2014.

(Continued)

*Primary Examiner* — Paul F Payer
(74) *Attorney, Agent, or Firm* — Sheppard, Mullin, Richter & Hampton LLP (57) ABSTRACT

A method of forming a halftone screen, the method comprising: representing a first tone range by forming a plurality of dots arranged in a grid; representing a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and representing a third tone range by forming a plurality of substantially cross-shaped dots arranged in a grid, the cross-shaped dots contained within respective dot cells and having four arms, a proximal end of at least one of the arms wider than the proximal end of at least one arm of the cross-shaped dots representing the second tone range, the third tone range darker than the second tone range.

43 Claims, 8 Drawing Sheets

(56) References Cited

U.S. PATENT DOCUMENTS

| | | | | |
|---|---|---|---|---|
| 6,072,592 A | * | 6/2000 | Ashworth | ............ G03F 5/00 |
| | | | | 358/1.9 |
| 6,198,545 B1 | * | 3/2001 | Ostromoukhov | ...... H04N 1/405 |
| | | | | 283/902 |
| 2009/0147315 A1 | | 6/2009 | Russell | |

FOREIGN PATENT DOCUMENTS

| | | |
|---|---|---|
| EP | 0527655 B1 | 11/2000 |
| WO | 9527365 A1 | 10/1995 |

OTHER PUBLICATIONS

International Application No. PCT/IB2013/060963, International Preliminary Report on Patentability mailed Jun. 30, 2015.

* cited by examiner

FIGURE 20

METHOD AND SYSTEM FOR FORMING A HALFTONE SCREEN

CROSS-REFERENCE TO RELATED APPLICATIONS

This application is a national stage application pursuant to 35 U.S.C. §371 of International Application No. PCT/IB2013/060963, filed Dec. 15, 2013, which claims priority to U.S. Provisional Patent Application Ser. No. 61/745,667, filed Dec. 24, 2012, the disclosures of which are hereby incorporated by reference herein.

FIELD OF INVENTION

The invention relates to methods and systems for forming a halftone screen.

BACKGROUND TO THE INVENTION

Colour images are typically printed using three or more colours and black. These colours are known as process colours. Common process colours comprise cyan, magenta and yellow. Black is also used to improve the printing of dark areas. A large range or gamut of colours can be reproduced by printing the process colours in different combinations, together with black. Some printing techniques use other colours either in addition or in substitution for cyan, magenta, yellow and black.

A given colour is reproduced by adjusting the amount of each of the process colours and black. This is achieved by adjusting the ratio of ink to white paper for each process colour and black. Generally the ratio of ink to white paper is controlled by printing each process colour in a series of dots that vary in either size or frequency. The pattern of dots for each process colour is called a halftone pattern, a halftone screen or a screen.

The combination of the individual halftone screens for each process colour and black results in the appearance of the full colour image.

In traditional amplitude modulated screening, the ratio of ink to white paper is controlled by varying the size of individual dots. The dots are arranged on a grid that is defined by the number of lines per inch. This is known as the screen ruling or screen frequency. The grid can be either orthogonal or non-orthogonal.

The grids for each process colour and black will generally be on different angles known as screen angles. In irrational screening, which is a commonly used technique, three orthogonal grids of the same screen ruling are rotated to intervals of 30° relative to each other. The three grids typically represent cyan, magenta and black respectively. A fourth screen for the yellow colour may be of a slightly different screen ruling or frequency which is generally arranged at 15° to two of the other screens. This arrangement results in a pattern that incorporates a series of circular features known as rosettes.

An individual grid comprises an array of cells known as dot cells. Each dot cell generally contains a maximum of one dot. In the case of an orthogonal grid, the dot cells are square.

There are a variety of dot shapes that are used to create halftone screens. Each dot shape is made up of n individual shapes that begin with a white dot cell representing 0% tone. The dot shape is formed and increases in size as the tone darkens (the level of density increases). Eventually a dot cell is formed that is completely filled with ink representing the 100% tone, i.e., the dot shape covers 100% of the area of the dot cell. As the area covered by the dot increases, the density of ink is said to increase or, alternatively, the tone is said to become darker. Often n will be 255 since this number of individual dot shapes, also representing the number of density levels, is an industry norm.

Three traditionally used dot shapes are round dots, elliptical dots and square dots (usually found on a 45 degree orientation where the sides of the dot are orientated at 45 degrees to the edge of the dot cell. Another traditionally used dot shape is the inverse round dot, see for example U.S. Pat. No. 5,680,222. All of these dot shapes have a tendency, when used in a number of screens to make colour images, to result in rosettes that are apparent, particularly at lower screen rulings. The apparentness of rosettes makes the image appear less smooth than an image with less apparent rosettes. The apparentness of the rosettes can vary according to the precise registration of the screens in the image. Precise registration can be difficult to control in practice. The large open white spaces between dots of the traditionally used shapes contributes to the apparentness of the rosettes.

It is an object of preferred embodiments of the present invention to address some of the aforementioned disadvantages of the traditionally used dot shapes. An additional and/or alternative object is to at least provide the public with a useful choice.

SUMMARY OF INVENTION

In broad terms in one form the invention comprises a method of forming a halftone screen, the method comprising representing a first tone range by forming a plurality of dots arranged in a grid; representing a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and representing a third tone range by forming a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range.

Preferably at least some of the dots representing the first tone range are substantially circular.

Preferably at least some of the dots representing the first tone range are substantially cross-shaped.

Preferably at least some of the dots representing the first tone range are contained within respective dot cells.

Preferably at least some of the dots representing the first tone range are contained within respective pairs of adjacent dot cells.

Preferably at least one pair of adjacent dot cells contains dots of different sizes.

Preferably at least one pair of adjacent dot cells contains dots of different orientations.

Preferably at least one dot within a pair of adjacent dot cells is rotated substantially 90 degrees with respect to the other dot within the pair of adjacent dot cells.

Preferably the cross-shaped dots representing the first tone range have four arms of substantially equal length.

Preferably the cross-shaped dots representing the first tone range have a first pair of opposing arms of substantially equal length and a second pair of opposing arms of substantially equal length, the first pair of arms having a different length to the second pair of arms.

Preferably at least one of the four arms of the cross-shaped dots representing the second tone range extend(s) radially toward a mid-point of an edge of an adjacent dot cell.

Preferably the four arms of the cross-shaped dots representing the second tone range are of substantially equal length.

Preferably the cross-shaped dots representing the second tone range have a first pair of opposing arms of substantially equal length and a second pair of opposing arms of substantially equal length, the first pair of arms having a different length to the second pair of arms.

Preferably the four arms of the cross-shaped dots representing the second tone range have distal ends of substantially equal width.

Preferably the four arms of the cross-shaped dots representing the second tone range have proximal ends of substantially equal width.

Preferably the cross-shaped dots representing the second tone range define a plurality of substantially cross-shaped non-printed areas.

Preferably at least one of the four arms of the cross-shaped dots representing the third tone range extend(s) radially toward a mid-point of an edge of an adjacent dot cell.

Preferably the four arms of the cross-shaped dots representing the third tone range are of substantially equal length.

Preferably a distal end of at least one of the arms of at least one of cross-shaped dots representing the third tone range is wider than a proximal end.

Preferably the cross-shaped dots representing the third tone range have a first pair of opposing arms of substantially equal length and a second pair of opposing arms of substantially equal length, the first pair of arms having a different length to the second pair of arms.

Preferably the four arms of the cross-shaped dots representing the third tone range have distal ends of substantially equal width.

Preferably the four arms of the cross-shaped dots representing the third tone range have proximal ends of substantially equal width.

Preferably the cross-shaped dots representing the third tone range define a plurality of substantially cross-shaped non-printed areas.

In another form the invention comprises a tangible computer readable medium having stored thereon computer-executable instructions for performing a method of forming a halftone screen, the method comprising representing a first tone range by forming a plurality of dots arranged in a grid representing a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and representing a third tone range by forming a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range.

Preferably at least some of the dots representing the first tone range are substantially circular.

Preferably at least some of the dots representing the first tone range are substantially cross-shaped.

Preferably at least some of the dots representing the first tone range are contained within respective dot cells.

Preferably at least some of the dots representing the first tone range are contained within respective pairs of adjacent dot cells.

Preferably at least one pair of adjacent dot cells contains dots of different sizes.

Preferably at least one pair of adjacent dot cells contains dots of different orientations.

Preferably at least one dot within a pair of adjacent dot cells is rotated substantially 90 degrees with respect to the other dot within the pair of adjacent dot cells.

Preferably the cross-shaped dots representing the first tone range have four arms of substantially equal length.

Preferably the cross-shaped dots representing the first tone range have a first pair of opposing arms of substantially equal length and a second pair of opposing arms of substantially equal length, the first pair of arms having a different length to the second pair of arms.

Preferably at least one of the four arms of the cross-shaped dots representing the second tone range extend(s) radially toward a mid-point of an edge of an adjacent dot cell.

Preferably the four arms of the cross-shaped dots representing the second tone range are of substantially equal length.

Preferably the cross-shaped dots representing the second tone range have a first pair of opposing arms of substantially equal length and a second pair of opposing arms of substantially equal length, the first pair of arms having a different length to the second pair of arms.

Preferably the four arms of the cross-shaped dots representing the second tone range have distal ends of substantially equal width.

Preferably the four arms of the cross-shaped dots representing the second tone range have proximal ends of substantially equal width.

Preferably the cross-shaped dots representing the second tone range define a plurality of substantially cross-shaped non-printed areas.

Preferably at least one of the four arms of the cross-shaped dots representing the third tone range extend(s) radially toward a mid-point of an edge of an adjacent dot cell.

Preferably the four arms of the cross-shaped dots representing the third tone range are of substantially equal length.

Preferably a distal end of at least one of the arms of at least one of cross-shaped dots representing the third tone range is wider than a proximal end.

Preferably the cross-shaped dots representing the third tone range have a first pair of opposing arms of substantially equal length and a second pair of opposing arms of substantially equal length, the first pair of arms having a different length to the second pair of arms.

Preferably the four arms of the cross-shaped dots representing the third tone range have distal ends of substantially equal width.

Preferably the four arms of the cross-shaped dots representing the third tone range have proximal ends of substantially equal width.

Preferably the cross-shaped dots representing the third tone range define a plurality of substantially cross-shaped non-printed areas.

In another form the invention comprises a halftone screen comprising a first tone range comprising a plurality of dots arranged in a grid; a second tone range comprising a plurality of substantially cross-shaped dots arranged in a grid, the cross-shaped dots contained within respective dot cells and having four arms, a distal end of at least one of the arms wider than a proximal end, the second tone range darker than the first tone range; and a third tone range comprising a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range.

In another form the invention comprises a printing system comprising a memory; a processor programmed to form at least one halftone screen and store the halftone screen in the memory, the processor further programmed to: represent a first tone range by forming a plurality of dots arranged in a grid; represent a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and represent a third tone range by forming a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range.

BRIEF DESCRIPTION OF FIGURES

Preferred forms of a method and system for forming a halftone screen will now be described with reference to the accompanying figures in which.

DETAILED DESCRIPTION

Referring to the drawings it will be appreciated that the various novel patterns and techniques must here be printed in black and white and magnified significantly for the purposes of a clear description. It will also be appreciated that the patterns and various shapes of the printed and non-printed areas may be implemented by an appropriate mathematical construction of a spot function or a threshold matrix using a wide range of hardware and software that is already available. A schematic indication of hardware and software systems that are suitable for implementing the invention will be given. Details are left to the skilled reader.

Figure 1:
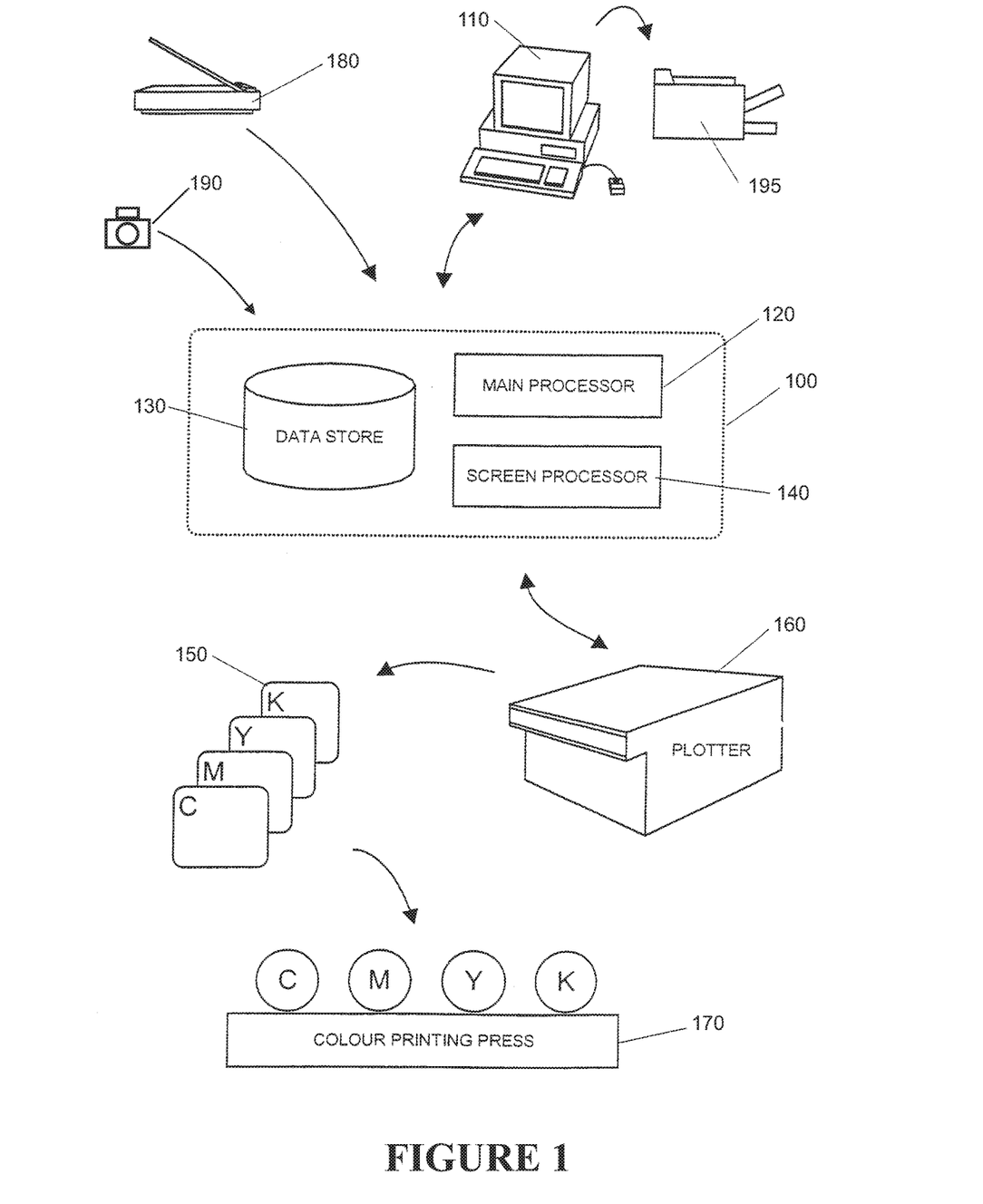
FIG. 1 shows conventional equipment used in preparing halftone screens.

FIG. 1 shows a schematic collection of computer-based or otherwise computer controlled equipment that might be used in production of halftone screens and in producing a result in printed form. A wide range of equipment and software is currently in use or under development and these items are shown by way of example only and for the purposes of explanation.

Part of the processing that relates most closely to the invention usually takes place in a computer processor arrangement 100. This may be a separate item of equipment as shown, or may be part of a more general item such as a processing device shown as a desktop computer 110.

Computer processing arrangement 100 includes further components such as a main processor 120 and data storage capacity 130. The device may optionally include a dedicated processor 140 for high speed processing of image data.

Halftone patterns or screens 150 produced by the processor are indicated as physical forms in the CMYK system. This physical form might be film from an imagesetter or laser plotter 160 for example, or printing plates for a press 170.

Alternatively the halftone screens may be represented by computer data in a portable memory storage component such as solid state, optical or magnetic storage media. The halftone screens may exist as data files in various formats which can then be saved or output to other devices such as platesetters, or digital printers.

An original image may be input to the equipment in various ways such as from a photograph or other tangible artwork scanned by a digital scanner 180 or an image captured in digital form by a digital camera 190. Alternatively the original image is created initially on a computer system such as desktop computer 110 interfaced to printer 195.

Figure 2:
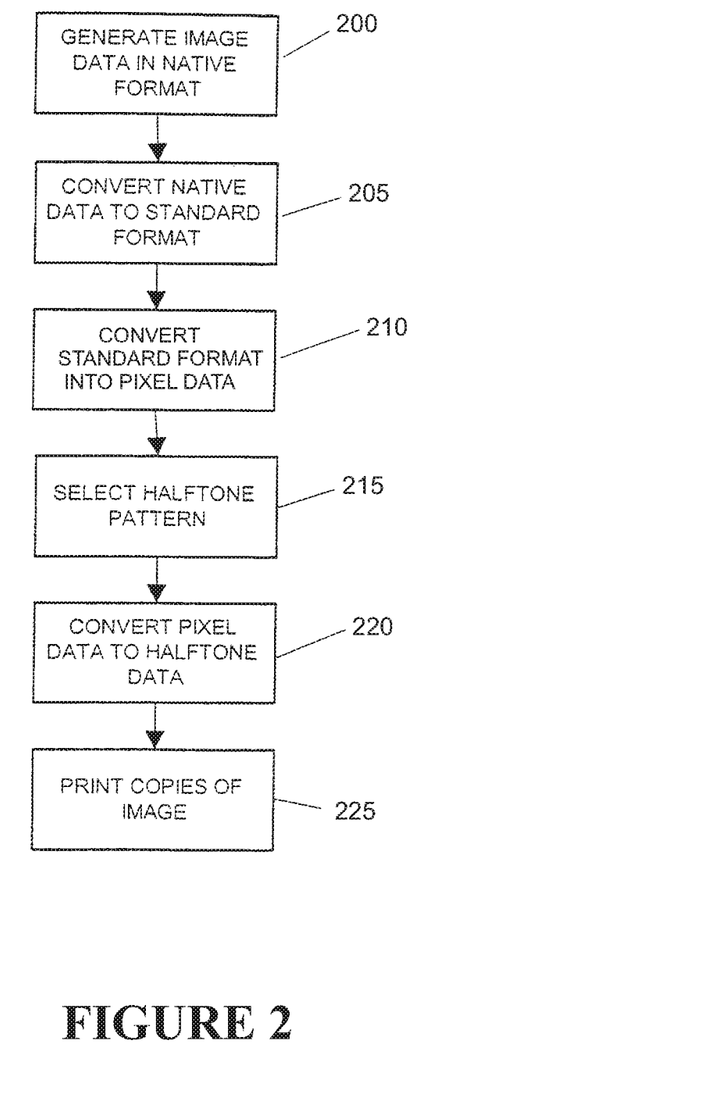
FIG. 2 shows a method for preparing a halftone screen.

FIG. 2 outlines a process for generating and printing halftone screens. An original digital image is created in step 200 on a computer device. The image data may be created using a graphics program and stored in a format which is native to the device such as a particular vector or bitmap format.

Parts of the image may also be imported from other sources such as clipart, a digital camera, or scanned photographs when composing a desktop publication for example. In step 205, the native data is converted into a standard format such as POSTSCRIPT or PDF which can be interpreted by an output device such as a local laser printer with a particular resolution.

The standard format is converted into pixel data in step 210 where the image is represented by an array of digital values. This process is known as rasterization and usually occurs inside a raster image processing program or RIP.

A wide variety of patterns and processes are then available for conversion of the pixel data to halftone screen data. Details appropriate to a particular image are selected automatically or by an operator in step 215. The conversion processes take place in step 220 by way of a computer system 100 such as that indicated in FIG. 1.

The patterns are generally created from the pixel information by a RIP or other software. The program calculates the locations, spacings, sizes and shapes of the dots for each colour separation.

An operator normally has a range of standard patterns installed on the equipment and may be able to develop variations of those patterns in some cases. Traditional calculations involve screen frequencies, angles and dot shapes, although more sophisticated equipment enables patterns to be created without reference to these parameters. The operator is able to proof and modify the selection of patterns to minimise various effects such as moiré, colour shift and tone jump according to the subsequent reproduction technique.

The RIP or other software then stores the halftone screen data in a format such as black and white bitmap file in computer memory.

Copies of the original image may then be printed in step 225 or sent to a platesetter, stored in an electronic format such as a TIFF file, or transferred elsewhere from the stored data as required, depending on the manner in which the image will be published and the equipment which is available.

Figure 3:
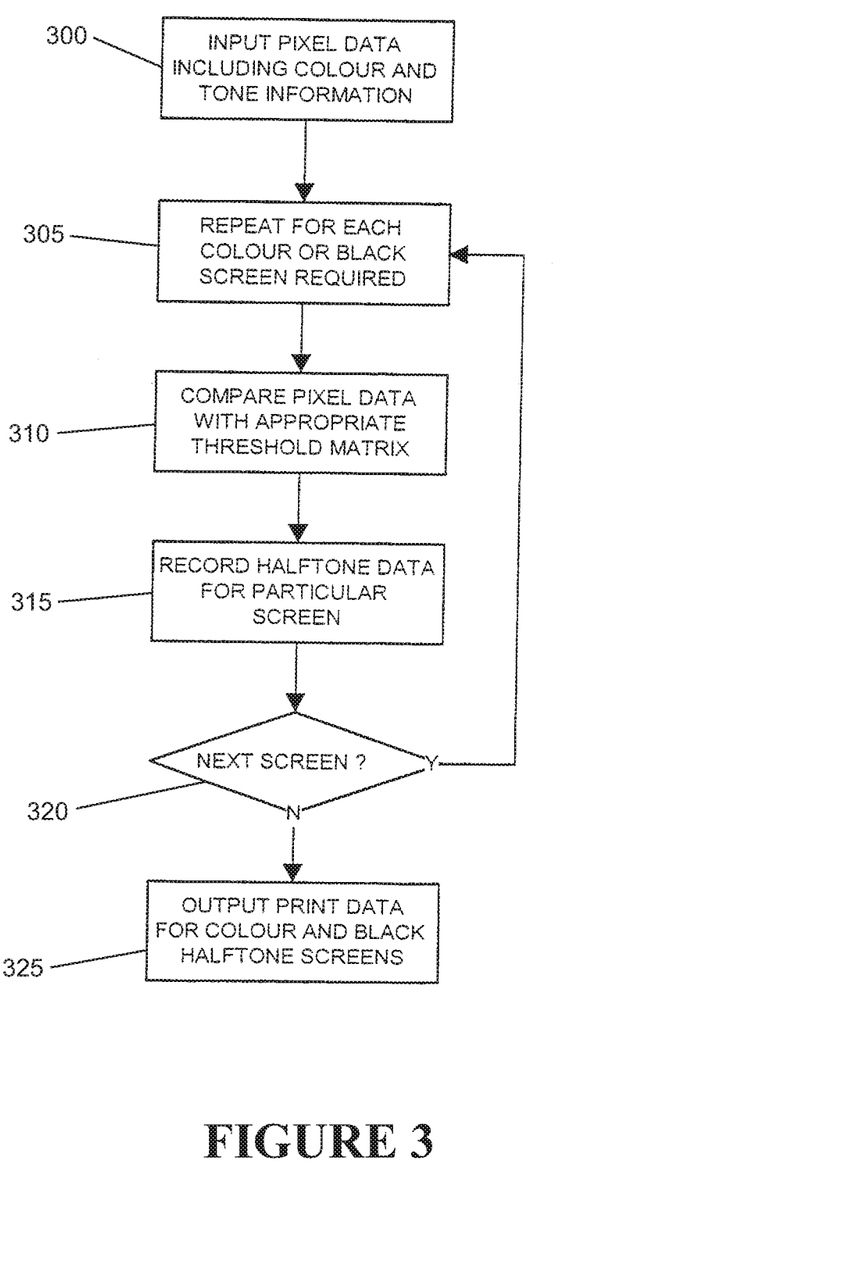
FIG. 3 shows a conversion process from the methods shown in FIG. 2.

FIG. 3 outlines the conversion process of step 220 from FIG. 2. The step is generally carried out by known RIP or other software. The process first receives pixel data including colour and tone information in step 300. Each pixel includes data which enables determination of a tone value for each of the colours in a chosen colour system. This colour system is usually CMYK. The tone value is determined for a small area located at the point represented by the pixel in the coloured image.

The generation of a halftone screen for each of the colours produces a large amount of data that may be stored in a common computer file or in separate files. This data usually takes the form of binary on/off instructions in relation to the output grid of a printing device.

In steps 305, 310, 315 and 320 the pixel data is parsed for each of the required colours to determine halftone screen information for that colour. Mathematical constructs called spot functions or threshold matrices are used in step 310 to determine the halftone patterns that have been selected for the colours.

Each pixel is compared with a threshold matrix for the particular colour. Binary data relating to the output grid of the particular printing device is determined and stored in an appropriate computer file in step 315. Eventually the colour separation is complete and the halftone screen data can be stored or output to a device such as a platesetter or a printer in step 325 when required.

The techniques described below provide a sequence of dot shapes that seek to improve upon the traditionally used dot shapes. The techniques described below have the potential to produce a sharper higher contrast look in the mid to three-quarter tones. The techniques described below seek to at least address the traditional disadvantage of the traditionally used dot shapes in producing coarser images with more apparent rosettes than can be achieved with the invention.

The dot configurations of the present invention seek to improve the mid to three-quarter tone by partially suppressing the appearance of the rosette. This occurs because the dots put ink into the centre of the rosette. Other commonly used dot shapes such as round or elliptical dots or inverse round dots tend to leave white space at the centre of the rosette. The contrast between the white space at the centre and the ink around the edge makes rosettes more noticeable in print.

The techniques described below seek to retain the penetration of ink into the corners of the dot cell for as much of the range of the dot shape as possible, while allowing for a non printed area that suits the limitations of the printing process.

Figure 4:
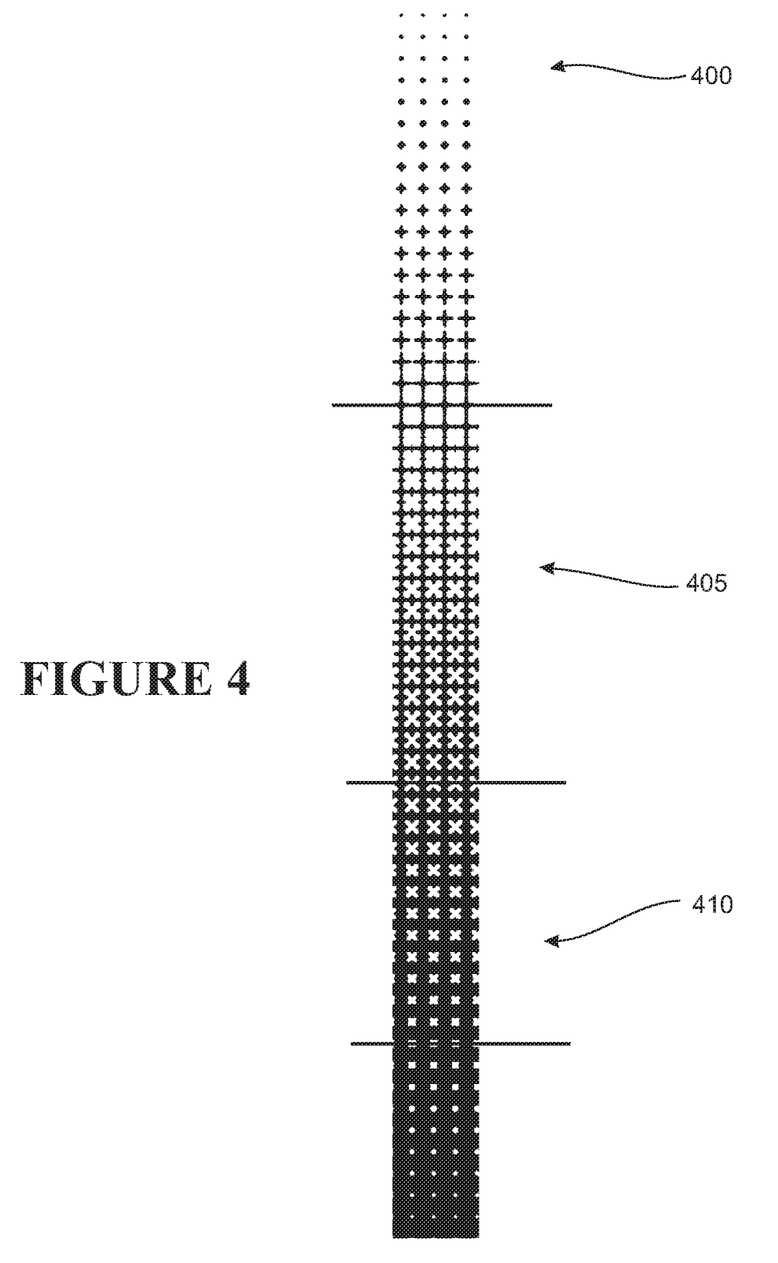
FIG. 4 shows a gradation illustrating the range of dot shapes of the invention.

FIG. 4 shows a gradation that shows a series of ranges of dot shapes representing darkening tone from top to bottom. The halftone screen is typically formed by representing a first tone range 400 by forming a plurality of dots arranged in a grid. It is anticipated that the grid is either orthogonal or non-orthogonal. In one embodiment the grid is substantially regular. In a further embodiment the grid is at least partly distorted.

Subsequent tone ranges are also shown in the gradation, for example a second tone range 405 and a third tone range 410. These tone ranges are described further below with reference to FIG. 4 and subsequent figures.

The dot shapes shown in FIG. 4 and subsequent figures relate to a single colour. In practice there may be four different screens, one for each of cyan, magenta, black and yellow and each on a different screen angle. It is anticipated that the dot shapes shown below are used for at least one of these colours. In FIG. 4 the dots are shown on an orthogonal grid at a screen angle of 45 degrees.

Figure 5:
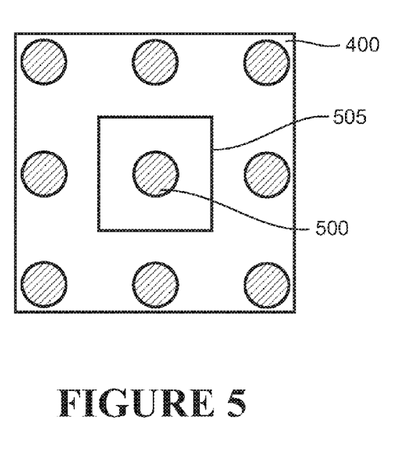
FIG. 5 shows preferred form dot shapes in a first tone range from FIG. 4.
Figure 6:
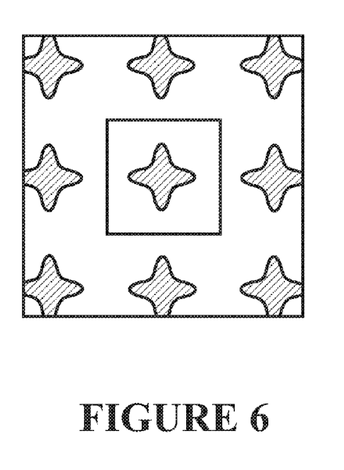
FIGS. 6 to 9 show alternative preferred form dot shapes in a first tone range from FIG. 4.
Figure 7:
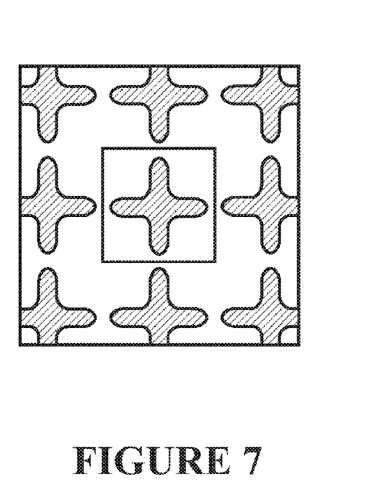
Figure 8:
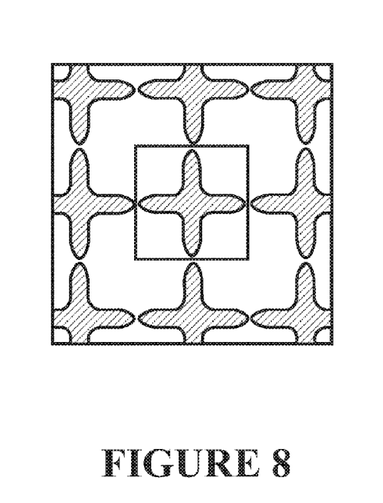
Figure 9:
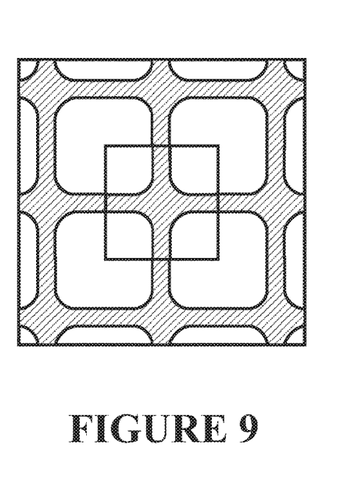

FIG. 5 shows preferred form dots representing the lighter tones within the first tone range 400. One example dot is shown at 500 within a dot cell 505. The dot cell 505 represents the maximum size that a dot 500 can assume. It is anticipated that there is generally one dot 500 per dot cell 505. However, as shown below a further preferred embodiment involves dots that are contained within a pair of adjacent dot cells. An array of dot cells or adjacent pairs of dot cells form a grid that, together with the dots contained in at least some of the dot cells, comprises the halftone screen.

Dot 500 and neighbouring dots are shown as substantially circular. It will be appreciated that other dot shapes are possible within the first tone range 400. One example is a substantially cross-shaped dot. FIGS. 6, 7, 8 and 9 show preferred form dots that are substantially cross-shaped. Preferably FIGS. 5 to 9 represent increasingly darker tones within the first tone range 400. The cross-shaped dots of FIGS. 6, 7, 8 and 9 have four arms of substantially equal length. Preferably each of the arms extends radially toward a midpoint of an edge of an adjacent dot cell. It will be appreciated that not each arm is required to extend radially and not each arm is required to extend toward a midpoint of an edge of an adjacent dot cell.

The cross shaped dots of FIGS. 6 to 9 have four arms. Preferably the distal ends of the arms are narrower than the proximal ends of the arms.

Referring to FIG. 4, the method further includes representing a second tone range 405 by forming a plurality of dots arranged in a grid. The dots representing the second tone range are typically larger in size than the dots representing the first tone range 400. The dots representing the second tone range have smaller non-printed areas within the dot cells. As is apparent from FIG. 4, the second tone range 405 is darker than the first tone range 400.

Figure 10:
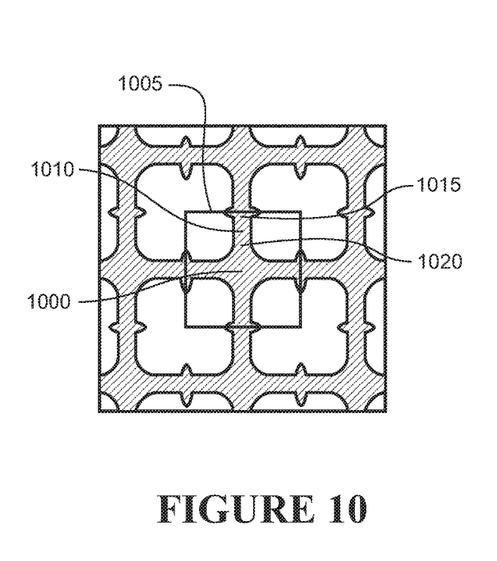
FIG. 10 shows a preferred form dot forming part of the second tone range from FIG. 4.

FIG. 10 shows a magnified view of a dot 1000 within a dot cell 1005. Dot 1000 is representative of a dot forming part of the second tone range 405. The preferred form shape of the dot 1000 is substantially cross-shaped. As shown in FIG. 10, the cross shaped dot 1000 has four arms. Arm 1010 for example has a distal end 1015 and a proximal end 1020. Distal end 1015 of arm 1010 is wider than proximal end 1020 of the arm.

Preferred dot 1000 has four arms that each extend radially toward a midpoint of an edge of an adjacent dot cell. It will be appreciated that not all of the arms are required to extend radially and not all of the arms are required to extend toward a midpoint of an edge of an adjacent dot cell.

The arms of dot 1000 are shown as being of substantially equal length. It will be appreciated that the arms are not required to be of equal length. Preferably the distal ends of each arm are the same width as each other. Preferably the proximal ends of each arm are the same width as each other.

Figure 11:
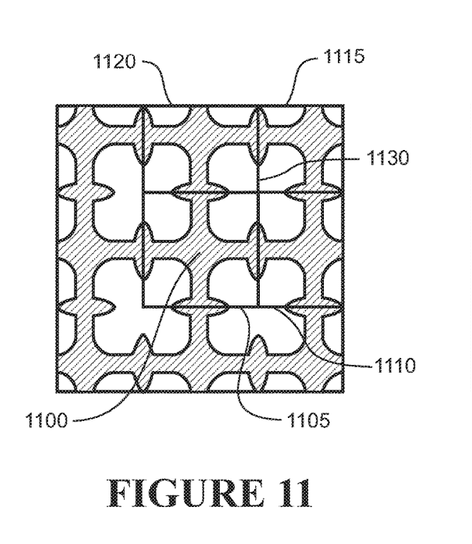
FIGS. 11 and 12 show alternative preferred form dot shapes in a second tone range from FIG. 4.
Figure 12:
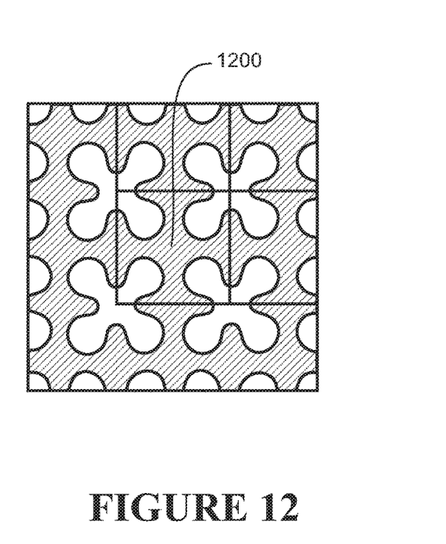

FIGS. 11 and 12 show preferred form dots forming a darker tone within the second tone range than the dots of FIG. 10. The distal arms of dot 1100 for example are of a greater width than the distal arms of dot 1000. Similarly, the distal arms of dot 1200 are greater in width than the distal arms of dot 1100 and dot 1000.

As shown in FIG. 11, dot 1100 is contained within a dot cell 1105. Dot cell 1105 has neighbouring dot cells. Three of these neighbouring dot cells are partially shown at 1110, 1115 and 1120. The dots within dot cells 1105, 1110, 1115 and 1120 define a substantially cross shaped non printed-area 1130 typically on a 45° angle to dot 1100. This cross shaped non-printed area is also shown in FIG. 12.

Referring to FIG. 4, the halftone screen includes a third tone range 410 comprising a plurality of dots arranged in a grid. The dots representing the third tone range 410 are typically larger in size than the dots representing the second tone range 405. The dots representing the third tone range have smaller non-printed areas within the dot cells. As is apparent from FIG. 4, the third tone range 410 is darker than both the second tone range 405 and the first tone range 400.

Figure 13:
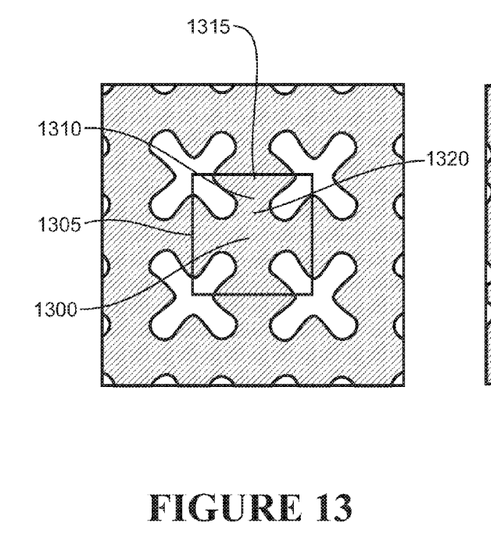
FIG. 13 shows a preferred form dot forming part of a third tone range from FIG. 4.

FIG. 13 shows a more detailed view of a dot 1300 forming part of the third tone range 410. The dot 1300 is presented within a dot cell 1305. It is anticipated that there is generally one dot 1300 per dot cell 1305.

Preferred form dot 1300 is substantially cross shaped and has four arms. Preferably the arms forming part of the dot 1300 are substantially the same length as each other and radially extend toward a midpoint of an edge of an adjacent dot cell.

One of the arms is indicated at 1310 having a distal end 1315 and a proximal end 1320. Distal end 1315 is preferably of substantially similar width to the distal end of each arm of dot 1200 shown in FIG. 12. The proximal end 1320 of arm 1310 is wider than the proximal end of each arm of dot 1200.

Figure 14:
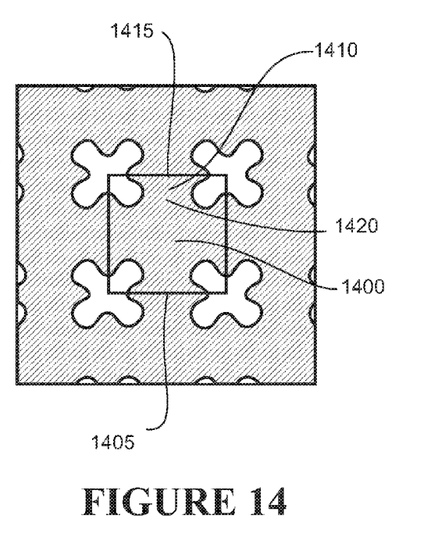
FIG. 14 shows an alternative preferred form dot shape in a third tone range from FIG. 4.

FIG. 14 shows a further preferred form dot 1400 within the third tone range. The dot 1400 is contained within a dot cell 1405. Dot 1400 preferably includes four arms of substantially equal length, radially extending toward respective midpoints of the edges of adjacent dot cells. One of the arms is indicated at 1410. A distal end 1415 of the arm is substantially the same width as the distal end 1315 of arm 1310 in FIG. 13. However the proximal end 1420 is wider than the proximal end 1320 of the arm 1310 shown in FIG. 13.

Figure 15:
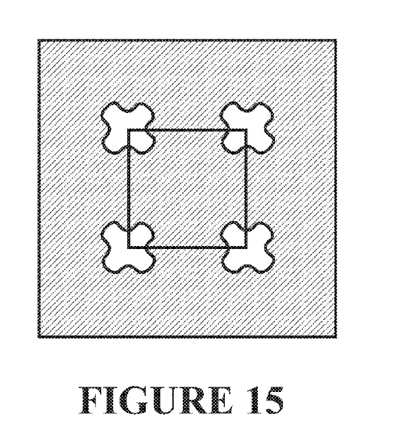
FIGS. 15 and 16 show larger dots and decreasing non-printed areas.
Figure 16:
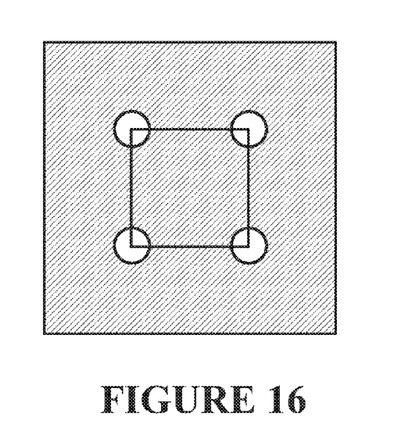

FIGS. 15 and 16 show larger dots and decreasing non-printed areas to achieve darker tone ranges.

The dots described above representing the first tone range, second tone range and third tone range involve dots of various sizes and shapes contained within respective dot cells. Described below with reference to FIGS. 17 to 20 are alternative preferred form dot shapes forming the first tone range. In the dot shapes described below dots are contained within respective pairs of adjacent dot cells.

Figure 17:
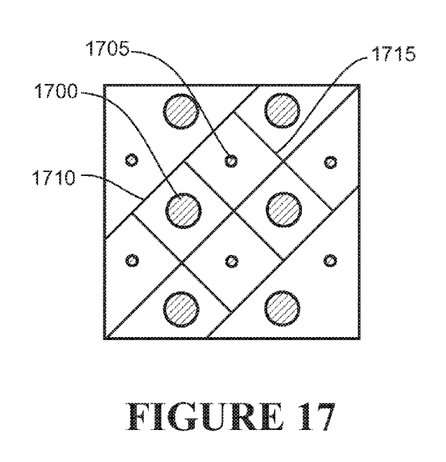
FIGS. 17 to 20 show alternative preferred form dot shapes forming the first tone range.

FIG. 17 shows preferred form dots representing the lighter tones within the first tone range 400. FIG. 17 shows two substantially circular dots 1700 and 1705. Dot cell 1710 includes dot 1700 and dot cell 1715 includes dot 1705.

Dot 1700 is substantially the same size as dot 500 shown in FIG. 5. Dot 1705 is a different size to dot 1700, preferably smaller. Dot cell 1710 together with adjacent dot cell 1715 form a pair of adjacent dot cells.

Figure 18:
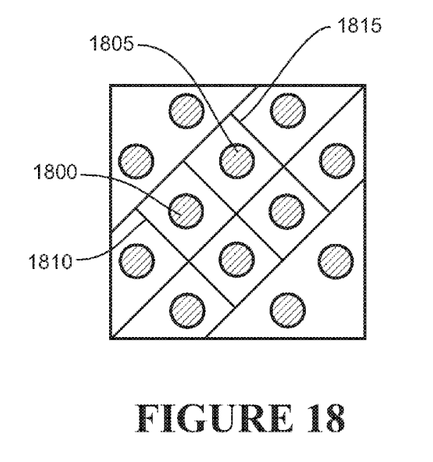

FIG. 18 shows further preferred form dots forming a darker tone within the first tone range than the dots shown in FIG. 17. FIG. 18 shows dots 1800 and 1805. Each of these dots is substantially circular and is approximately the same size as each other. Dots 1800 and 1805 are contained within respective dot cells 1810 and 1815.

Figure 19:
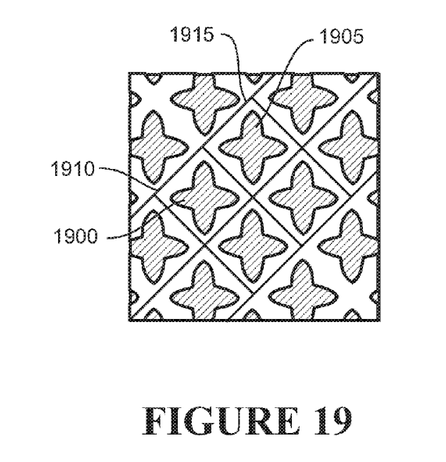

FIG. 19 shows a further preferred form dot forming a darker tone within the first tone range than the dots shown in FIG. 17 or 18. Shown in FIG. 19 are dots 1900 and 1905. Each of the substantially cross-shaped dots shown in FIG. 19 is approximately the same shape but slightly larger than the cross-shaped dot shown above in FIG. 6.

Dots 1900 and 1905 are contained within respective dot cells 1910 and 1915.

Figure 20:
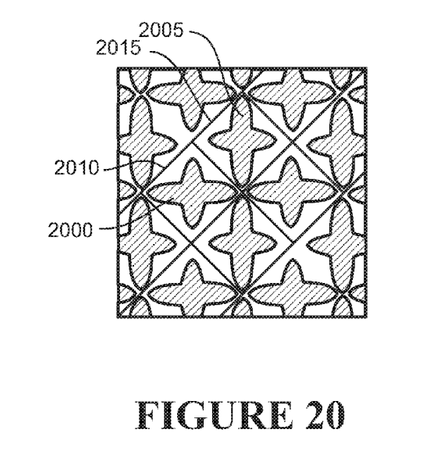

FIG. 20 shows preferred form cross-shaped dots 2000 and 2005. Some or preferably all of the cross-shaped dots in FIG. 20 are provided with a first pair of opposing arms of substantially equal length and a second pair of opposing arms of substantially equal length. The first pair of arms is preferably of a different length to the second pair of arms.

As shown in FIG. 20, dots 2000 and 2005 are oriented differently to each other. Preferably dot 2005 is rotated 90 degrees with respect to dot 2000. It is anticipated that the angle of rotation is within the range of 45 to 135 degrees. Dot cell 2010 together with adjacent dot cell 2015 form a pair of adjacent dot cells.

Darker tones for the embodiment shown in FIGS. 17 to 20 are shown above in FIGS. 12, 13 and 14. In these figures there is a cross-shaped dot contained within respective dot cells. What is different about FIGS. 17 to 20 is that dot configurations are contained within pairs of adjacent dot cells rather than individual dot cells.

The present invention as described above provides a novel dot shape. This novel dot shape has the potential to reduce the width of the white areas that are printed in the mid to three-quarter tones, where the rosette tends to be most apparent. This results in a finer appearance and rosettes that are less apparent when compared to the traditionally used dot shapes, resulting in smoother, higher quality images when compared to images printed using the traditional dot shapes at the same screen rulings.

The foregoing describes the invention including preferred forms thereof. Modifications and improvements as would be obvious to those skilled in the art are intended to be incorporated in the scope hereof, as defined by the accompanying claims.

The invention claimed is:

1. A method of forming a halftone screen, the method comprising:

representing a first tone range by forming a plurality of dots arranged in a grid;

representing a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and representing a third tone range by forming a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range;

wherein the cross-shaped dots representing the second tone range or the cross-shaped dots representing the third tone range define a plurality of substantially cross-shaped non-printed areas.

2. The method of claim 1 wherein at least some of the dots representing the first tone range are substantially circular.

3. The method of claim 2 wherein at least some of the dots representing the first tone range are contained within respective dot cells.

4. The method of claim 2 wherein at least some of the dots representing the first tone range are contained within respective pairs of adjacent dot cells.

5. The method of claim 4 wherein at least one pair of adjacent dot cells contains dots of different sizes.

6. The method of claim 4 wherein at least one pair of adjacent dot cells contains dots of different orientations.

7. The method of claim 6 wherein at least one dot within a pair of adjacent dot cells is rotated substantially 90 degrees with respect to the other dot within the pair of adjacent dot cells.

8. The method of claim 1 wherein at least some of the dots representing the first tone range are substantially cross-shaped.

9. The method of claim 8 wherein the cross-shaped dots representing the first tone range have four arms of substantially equal length.

10. The method of claim 1 wherein at least one of the four arms of the cross-shaped dots representing the second tone range extend(s) radially toward a mid-point of an edge of an adjacent dot cell.

11. The method of claim 1 wherein the four arms of the cross-shaped dots representing the second tone range are of substantially equal length.

12. The method of claim 1 wherein the cross-shaped dots representing the first tone range or the cross-shaped dots representing the second tone range have a first pair of opposing arms of substantially equal length and a second pair of opposing arms of substantially equal length, the first pair of arms having a different length to the second pair of arms.

13. The method of claim 1 wherein the four arms of the cross-shaped dots representing the second tone range have distal ends of substantially equal width.

14. The method of claim 1 wherein the four arms of the cross-shaped dots representing the second tone range have proximal ends of substantially equal width.

15. The method of claim 1 wherein at least one of the four arms of the cross-shaped dots representing the third tone range extend(s) radially toward a mid-point of an edge of an adjacent dot cell.

16. The method of claim 1 wherein the four arms of the cross-shaped dots representing the third tone range are of substantially equal length.

17. The method of claim 1 wherein a distal end of at least one of the arms of at least one of the cross-shaped dots representing the third tone range is wider than a proximal end.

18. The method of claim 1 wherein the cross-shaped dots representing the third tone range have a first pair of opposing arms of substantially equal length and a second pair of opposing arms of substantially equal length, the first pair of arms having a different length to the second pair of arms.

19. The method of claim 1 wherein the four arms of the cross-shaped dots representing the third tone range have distal ends of substantially equal width.

20. The method of claim 1 wherein the four arms of the cross-shaped dots representing the third tone range have proximal ends of substantially equal width.

21. A method of forming a halftone screen, the method comprising:

representing a first tone range by forming a plurality of dots arranged in a grid;

representing a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and representing a third tone range by forming a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range;

wherein the cross-shaped dots representing the first tone range or the cross-shaped dots representing the second tone range have a first pair of opposing arms of substantially equal length and a second pair of opposing arms of substantially equal length, the first pair of arms having a different length to the second pair of arms.

22. A non-transitory tangible computer readable medium having stored thereon computer-executable instructions for performing a method of forming a halftone screen, the method comprising:

representing a first tone range by forming a plurality of dots arranged in a grid;

representing a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and representing a third tone range by forming a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range;

wherein the cross-shaped dots representing the second tone range or the cross-shaped dots representing the third tone range define a plurality of substantially cross-shaped non-printed areas.

23. The medium of claim 22 wherein at least some of the dots representing the first tone range are substantially circular.

24. The medium of claim 23 wherein at least some of the dots representing the first tone range are contained within respective dot cells.

25. The medium of claim 23 wherein at least some of the dots representing the first tone range are contained within respective pairs of adjacent dot cells.

26. The medium of claim 25 wherein at least one pair of adjacent dot cells contains dots of different sizes.

27. The medium of claim 25 wherein at least one pair of adjacent dot cells contains dots of different orientations.

28. The medium of claim 27 wherein at least one dot within a pair of adjacent dot cells is rotated substantially 90 degrees with respect to the other dot within the pair of adjacent dot cells.

29. The medium of claim 22 wherein at least some of the dots representing the first tone range are substantially cross-shaped.

30. The medium of claim 29 wherein the cross-shaped dots representing the first tone range have four arms of substantially equal length.

31. The medium of claim 29 wherein the cross-shaped dots representing the first tone range have a first pair of opposing arms of substantially equal length and a second pair of opposing arms of substantially equal length, the first pair of arms having a different length to the second pair of arms.

32. The medium of claim 22 wherein at least one of the four arms of the cross-shaped dots representing the second tone range extend(s) radially toward a mid-point of an edge of an adjacent dot cell.

33. The medium of claim 22 wherein the four arms of the cross-shaped dots representing the second tone range are of substantially equal length.

34. The medium of claim 22 wherein the cross-shaped dots representing the second tone range have a first pair of opposing arms of substantially equal length and a second pair of opposing arms of substantially equal length, the first pair of arms having a different length to the second pair of arms.

35. The medium of claim 22 wherein the four arms of the cross-shaped dots representing the second tone range have distal ends of substantially equal width.

36. The medium of claim 22 wherein the four arms of the cross-shaped dots representing the second tone range have proximal ends of substantially equal width.

37. The medium of claim 22 wherein at least one of the four arms of the cross-shaped dots representing the third tone range extend(s) radially toward a mid-point of an edge of an adjacent dot cell.

38. The medium of claim 22 wherein the four arms of the cross-shaped dots representing the third tone range are of substantially equal length.

39. The medium of claim 22 wherein a distal end of at least one of the arms of at least one of cross-shaped dots representing the third tone range is wider than a proximal end.

40. The medium of claim 22 wherein the cross-shaped dots representing the third tone range have a first pair of opposing arms of substantially equal length and a second pair of opposing arms of substantially equal length, the first pair of arms having a different length to the second pair of arms.

41. The medium of claim 22 wherein the four arms of the cross-shaped dots representing the third tone range have distal ends of substantially equal width.

42. The medium of claim 22 wherein the four arms of the cross-shaped dots representing the third tone range have proximal ends of substantially equal width.

43. A printing system comprising:
a memory;
a processor programmed to form at least one halftone screen and store the halftone screen in the memory, the processor further programmed to:
represent a first tone range by forming a plurality of dots arranged in a grid;
represent a second tone range by forming a plurality of substantially cross-shaped dots arranged in a grid, the cross-shaped dots contained within respective dot cells and having four arms, a distal end of at least one of the arms wider than a proximal end, the second tone range darker than the first tone range; and
represent a third tone range by forming a plurality of substantially cross-shaped dots arranged in a grid, the cross-shaped dots representing the third tone range contained within respective dot cells and having four arms, a proximal end of at least one of the arms wider than the proximal end of at least one arm of the cross-shaped dots representing the second tone range, the third tone range darker than the second tone range;
wherein the cross-shaped dots representing the second tone range or the cross-shaped dots representing the third tone range define a plurality of substantially cross-shaped non-printed areas.

* * * * *